United States Patent
Neerinck et al.

(10) Patent No.: US 6,200,675 B1
(45) Date of Patent: Mar. 13, 2001

(54) DIAMOND-LIKE NANOCOMPOSITE COMPOSITIONS

(75) Inventors: Dominique Neerinck, Hertsberge (BE); Arvind Goel, Buffalo, NY (US)

(73) Assignee: N.V. Bekaert S.A., Zwevegem (BE)

( * ) Notice: Subject to any disclaimer, the term of this patent is extended or adjusted under 35 U.S.C. 154(b) by 0 days.

(21) Appl. No.: 09/171,614
(22) PCT Filed: Apr. 11, 1997
(86) PCT No.: PCT/EP97/01878
§ 371 Date: Mar. 15, 1999
§ 102(e) Date: Mar. 15, 1999
(87) PCT Pub. No.: WO97/40207
PCT Pub. Date: Oct. 30, 1997

(30) Foreign Application Priority Data

Apr. 22, 1996 (EP) .................................................. 96201070

(51) Int. Cl.$^7$ ........................................................ B05D 3/06
(52) U.S. Cl. .................. 428/336; 423/445 R; 423/415.1; 427/249; 427/530; 427/570; 427/574; 427/577; 427/578; 428/408
(58) Field of Search ...................................... 428/408, 336; 423/445 R, 415.1; 427/249, 530, 570, 574, 577, 578

(56) References Cited

U.S. PATENT DOCUMENTS 5,352,493 * 10/1994 Dorfman et al. ..................... 427/530

OTHER PUBLICATIONS

TATF 96. 5$^{TH}$ International Symposium on Trends and New Applications in Thin Films, Colmar, France, Apr. 1–3, 1996, No. 279, suppl. Issue, Vide Science, Technique Et Applications, Jan.–Mar. 1996, Soc. Francaise Due Vide, France, pp. 67–69, XP0000602985, Neerinck D Et Al: Tribological properties and structural investigation of diamondlike nanocomposites see the whole document.

* cited by examiner

Primary Examiner—Archene Turner
(74) Attorney, Agent, or Firm—Nixon & Vanderhye P.C.

(57) ABSTRACT

The invention relates to an improved diamond-like nanocomposite composition comprising networks of a-C:H and a-Si:O wherein the H-concentration is between 40% and 80% of the C-concentration and having a coefficient of friction against steel which is smaller than 0.1 in air with a relative humidity up to 90%, or in water. The invention relates also to a process for depositing the composition on a substrate in a vacuum chamber. The composition comprises preferably 30 to 70 at % of C, 20 to 40 at % of H, 5 to 15 at % of Si and 5 to 15 at % of O and can be doped with transition metals.

19 Claims, 2 Drawing Sheets

DIAMOND-LIKE NANOCOMPOSITE COMPOSITIONS

FIELD AND BACKGROUND OF THE INVENTION

The invention relates to a diamond-like nanocomposite (DLN) composition having improved (lower) friction properties combined or not with improved (higher) hardness. The invention deals also with an improved process for covering substrates with a layer or film of such a composition in a modified plasma assisted chemical vapour deposition (PACVD) process in vacuum.

Diamond-like nanocomposite (DLN) materials are related or similar to diamond-like carbon (DLC). DLC films (a-C:H, a-C, i-C) display a good combination of high hardness and elasticity, high wear resistance and a low coefficient of friction. Furthermore, because of their chemical inertness, low surface energy and intrinsic smoothness, these films give access to appealing industrial applications such as hard, self-lubricating films, eg. for protection of magnetic discs and media, sliding parts in motors, space applications, optical components etc. However, deposited DLC films exhibit much higher internal stresses (above 1 GPa) than DLN films (200–400 MPa), thus impeding good adhesion to the substrate. DLC films on substrates may thus require the use of intermediate adhesion promoting layers which is not needed for DLN. Another disadvantage of DLC impeding fast commercialisation is the fact that the coefficient of friction of DLC in air increases up to about 0.2 to 0.3 when the relative humidity rises above 50%.

DLN and methods for its deposition on substrates, such as glass, metal or Si-wafers are described in U.S. Pat. Nos. 5,352,493 and 5,466,431. By using the deposition processes disclosed in this patent, diamond-like nanocomposites are produced which consist of an (amorphous)a-C:H diamond-like network and an (amorphous)a-Si:O glass-like network. These networks interpenetrate into each other and some Si-C-bonds may be present. This patent describes generally broad parameter ranges for the deposition processes. The physical characteristics of the resulting coating layers are thus also ranging between large boundaries. It is not obvious how to select these parameters in view of reaching certain predetermined and interesting properties, such as the production of deposited layers with a very high degree of hardness and/or with a very low coefficient of friction, even in humid air with a relative humidity above 50% or in water or solutions or emulsions in water.

OBJECTS AND SUMMARY OF THE INVENTION

The invention now has succeeded in designing an improved diamond-like nanocomposite composition than heretofore available and having in particular a coefficient of friction against steel which is smaller than 0.1 in air with a relative humidity (=RH) up to 90%, respectively in water. The friction test for determining this coefficient is described below. The composition comprises networks of a-C:H and a-Si:O wherein the H-concentration is preferably between 40% and 80% of the C-concentration. This is different from the composition claimed in U.S. Pat. No. 5,466,431.

The composition can include (be doped with) at least one transition metal of the group 1b to 7b and 8 as described in U.S. Pat. No. 5,352,493. The controlled incorporation of metals in the DLN structure leads to highly tailorable optical and electrical properties while retaining to a great extent the mechanical and thermal stability. As an example the electrical resistivity of the films can be varied. The metals Zr, Ti and W are preferred. The diamond-like nanocomposite composition according to the present invention, either doped or undoped with transition metals, comprises preferably 30 to 70 at % of C, 20 to 40 at % of H, 5 to 15 at % of Si and 5 to 15 at % of O, in particular 45 to 70 at % of C, 20 to 35 at % of H, 5 to 10 at % of Si and 5 to 10 at % of O.

It is also an object of the invention to provide a diamond-like nanocomposite composition which comprises 0.5 to 5 at % of an inert gas. It has indeed been found that the incorporation of eg. Ar or Kr or N by ion bombardment may increase the hardness of the composition, even outside the specified ranges or proportions of C, H, Si and O indicated above. This hardness can amount to between 10 and 21 GPa as measured by a nano indentation test described below.

The composition is generally formed by deposition onto a substrate of any shape and made of glass, ceramics, metal, plastics or semiconductors. It is thus another object of the invention to provide a substrate covered at least in part with a layer of the diamond-like nanocomposite composition. The thickness of the layer is generally between $0.01\mu$ and 10 $\mu$m although it can be higher than 10 $\mu$m. It has in particular been found that the DLN-composition of the present invention adheres much better to glass than DLC.

The invention sets also the process parameters for manufacturing a covered substrate with the diamond-like nanocomposite composition having the friction and hardness properties described above. The process according to the invention for manufacturing a covered substrate is carried out in an improved vacuum chamber and comprises the steps of (a) introducing in said chamber a liquid organic precursor containing the elements C, H, Si and O to be deposited in the suitable proportions, (b) forming a plasma from the introduced precursor by an electron assisted DC-discharge using a filament with a filament current of 50–150 A, a negative filament bias DC voltage of 50–300 V and with a plasma current between 0.1 and 20 A and (c) depositing the composition on the substrate, to which a negative DC- bias or negative RF self-bias voltage of 200 to 1200 V is applied, in order to attract ions formed in the plasma.

To speed up and/or to better control the deposition process, the precursor can be evaporated in step (a) in said chamber during or after introduction, preferably by heating it between 30° C. and 150° C. This evaporation step is also useful for depositing other DLN-compositions outside the proportions specified above for C, H, Si and O. In step (c) the voltage is preferably between 250 and 1000 V and the frequency of the RF-voltage is best choosen between 30 and 1000 kHz.

The precursor is preferably an organosilicon compound, eg. a polyphenylmethylsiloxane such as triphenylnonamethylpentasiloxane.

When an inert gas is introduced in the vacuum chamber for incorporation into the deposited DLN-layer, it is ionised and incorporated by ion bombardment of the growing nanocomposite layer. Finally, when during the deposition process at least one transition metal is codeposited in the composition layer, then this is achieved by ion sputtering (eg. with argon) or by thermal evaporation.

The invention relates also to an improved apparatus as described below for carrying out the deposition process. In particular, new systems have been conceived for feeding the precursor to the vacuum chamber in a finely divided form, eg. as a vapour or mist and comprising optionally preheating arrangements for the precursor.

DETAILED DESCRIPTION, EXAMPLES

Figure 1:
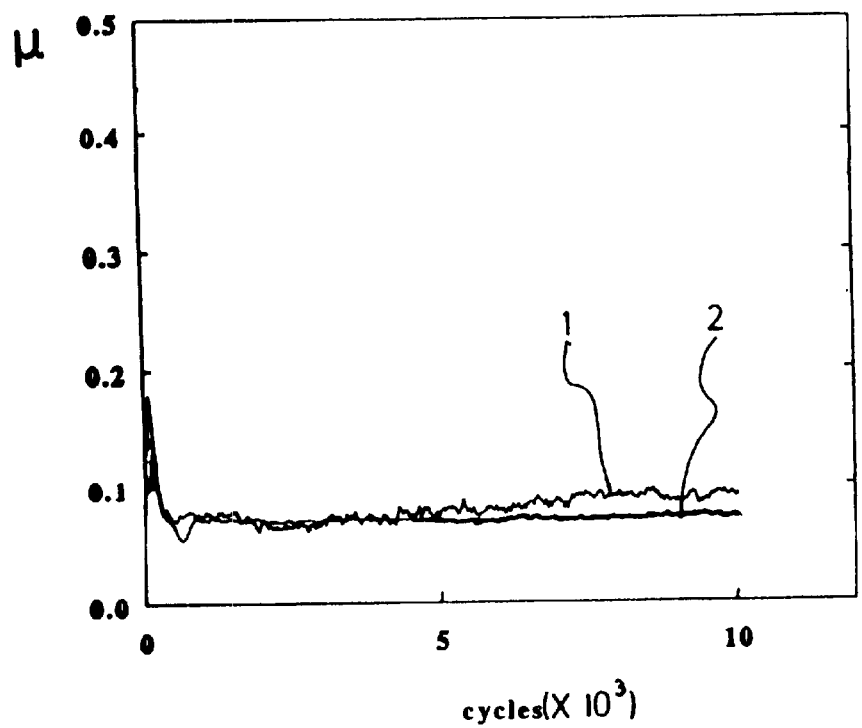
FIG. 1 is a graph showing the low coefficient of friction of an undoped DLN film (or coating) in air at 50% RH, respectively at 90% RH.

A number of deposition runs for DLN films on substrates (Si-wafers, glass- or steelplates) have been carried out in an improved vacuum reactor made by SINVACO N.V. (Belgium). Contrary to the reactor shown in U.S. Pat. No. 5,352,493 the new vacuum chamber is not subdivided in a plasma generation chamber and a vacuum deposition chamber but the two functions are performed in one single chamber. This is another aspect of the invention. The flat substrates (with a diameter up to 75 cm) were arranged on a rotatable support (in the upper part of the vacuum chamber) in a manner similar to that shown in U.S. Pat. No. 5,352,493. Spherical and otherwise shaped substrates can be covered as well. The base pressure in the vacuum chamber is $3 \times 10^{-7}$ mbar and the typical working pressure is maintained at $1 \times 10^{-4}$ to $1 \times 10^{-3}$ mbar by diffusions pumps (controlled with throttle valves). The substrates can be cleaned by an in-situ (Ar-) plasma etching process prior to deposition and lasting for 3 to 30 minutes. The substrate temperature does generally not exceed 200° C. during the deposition process. Film thicknesses vary generally between 0.1 and 3 $\mu$m and are determined by stylus profilometry. With a film thickness of less than about 1 $\mu$m, the deposited film remains transparent (even when coloured). The degree of transparency depends i.a. also on the bias voltage applied to the substrate during deposition. The deposition rate or film growth rate varies mostly between 0.5 and 2 $\mu$m/hr.

A preferred liquid precursor is triphenylnonamethylpentasiloxane in view of depositing a composition as defined in claim 2. It is preferably preheated above 30° C. before or during release in the chamber. The precursor is delivered to the vacuum chamber eg. through a heat resistant porous body with a porosity of eg. 30 to 50%. The precursor can continuously be metered in small quantities through a tube which delivers it as a vapour or a mist to the porous body. Otherwise the precursor can be introduced in batch in an open reservoir which is placed in the chamber before this is put to vacuum. This reservoir can be electrically heated prior to the start of the deposition process inside the chamber to form the vapour.

A bundle of alloyed Tungsten filaments is placed as a cathode typically at about −150 V (DC bias voltage) in front of the earthed porous body. The body itself, with the inlet tube for the precursor at the back side of the porous body may be mounted in the lower part of the chamber. The filament bundle is convexly bent eg. to a half circle in a vertical plane and with a length of 15 to 30 cm. The current in the cathode filaments is preferably between 50 and 120 A (AC). The plasma current (measured between filament bundle and earthed porous body) can then typically amount to about 0.5 to 3 A. Preheating the precursor may offer the advantage that the current needed afterwards in the cathode filaments (for generating the plasma) could be lowered.

The distance between the uppermost area of the bent cathode bundle and the substrate is at least about 20 cm. The deposition occurs from bottom to top through attraction of the plasma ions by the substrate support which is put to a negative RF self-bias voltage of typically about 400 V. Also the RF frequency is preferably much lower than that used according to U.S. Pat. No. 5,352,493: viz. between 100 and 500 kHz and specifically about 200 to 300 kHz.

When admitting an inert gas such as Ar, Kr or $N_2$ to the vacuum chamber, films can be deposited with higher hardness besides the favourable low friction properties. Then this additional inert process gas is ionised as a result of the combination of the DC discharge using a hot filament bundle and an RF or DC bias voltage on the substrate. The substrate bias or self-bias voltage, preferably in the range of 250 to 700 V, attracts the Ar, Kr or N ions to the substrate. This leads to a simultaneous inert gas ion bombardment of the growing diamond-like nanocomposite film. As a result the deposition rate decreases due to this cosputtering but the nanohardness of the deposition film increases. Typically, increasing the total working pressure during deposition from between 0.8 and $6.0 \times 10^{-4}$ mbar to between 0.5 and $5.0 \times 10^{-3}$ mbar by increasing the inert gas content in the chamber (while retaining the same bias or self-bias voltage on the substrate) increases the nanohardness, as measured by a "Nano-test 500" nano-indenter, from 10–15 GPa to about 13–20 GPa. The inert ion bombardment leads to the incorporation of a few atomic percent of the inert gas in the atomic structure of diamond-like nanocomposites. For the nano-indentation experiments the penetration depth is between 100 and 300 nm and 10 indentation hysteresis curves are averaged per sample. The hysteresis curves are analysed according to the Oliver & Pharr method (W. C. Oliver and G. M. Pharr, Journal of Materials Research 7 (1992), p.1564) and the data are normalised to the data of a Si(111) wafer obtained at the same penetration depth.

Using the process parameter limits and apparatus features described above, a number of DLN compositions, undoped or doped with metals were deposited with compositions within the ranges set above. Friction tests at room temperature (25° C.) were carried out to determine the wear resistance and friction coefficient $\mu$ using standard ball-on-disk measurements. For these tests 100Cr6 steel bearing balls with a diameter of 6.35 mm were used at room temperature in a CSEM tribometer at a normal load of 5N (friction coefficient test) or 10 N (wear resistance/life-time test). The ball is sliding unlubricated at a speed of 0.2 m/s during a great number of cycles in a circular path over the surface of the film as deposited on the substrate. The coefficient of friction $\mu$ is continuously measured during the test. The relative humidity was thereby monitored at a constant value of either 50% RH or 90% RH. The measurement is stopped when $\mu$ reaches the value of 0.5. The wear resistance (life-time) of the deposited nanocomposite film is expressed as the number of cycles divided by the film thickness. Typical lifetimes range between 100,000 and 300,000 cycles per $\mu$m of film thickness.

The average compositions (in at %) tested are given in the Table 1 below. The real compositions may fluctuate throughout the film thickness up to 10× of these average compositions. This means that with an average content of eg. 25%at H, the real concentration may vary between 22.5 and 27.5%at H.

TABLE 1

| samples | H (at %) | C | Si | O | Zr | Ar | hardness (Gpa) |
|---|---|---|---|---|---|---|---|
| A (FIG. 1) | 32 | 52 | 10 | 6 | — | — | 13 |
| B (FIG. 2) | 30.5 | 44 | 12.5 | 7.5 | 4.1 | 1.4 | 14.4 |
| C | 27.2 | 56.6 | 8.2 | 6.4 | — | 1.5 | 17 |

Line 1 (in FIG. 1) corresponds to the evolution of the friction coefficient for a test in air with RH 50% and a normal ball load of 5 N for sample A in Table 1. Line 2 corresponds to the same test for sample A, but in air with RH 90%. The test with the higher RH shows even a better friction performance.

Figure 2:
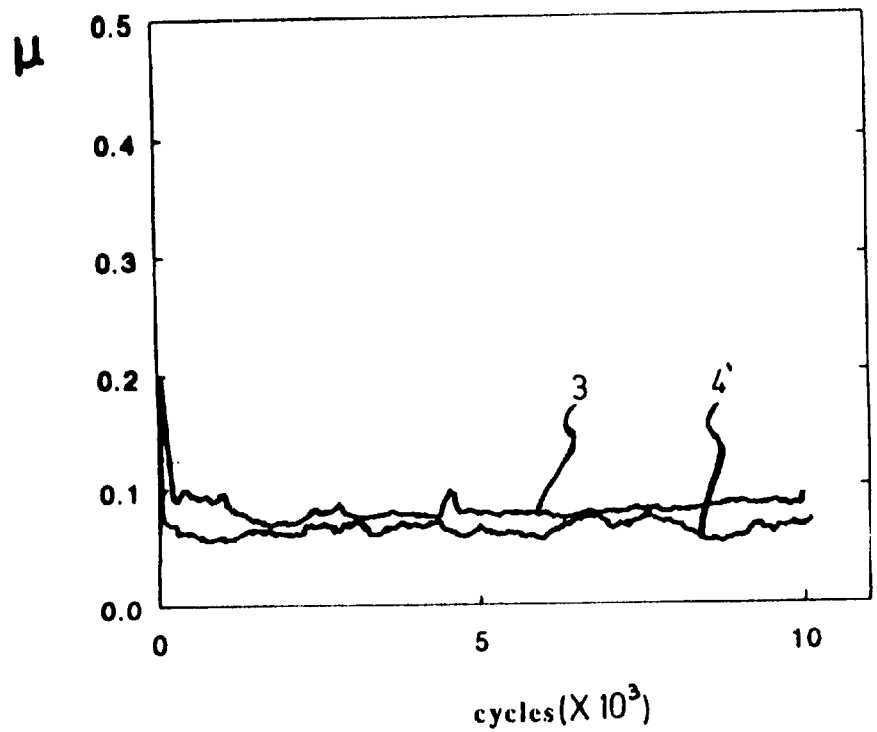
FIG. 2 is a similar graph for a DLN film doped with about 5 at % Zr.

In FIG. 2, line 3 shows the friction behaviour in air at 90% RH and line 4 the somewhat better friction behaviour in air at 50% RH for sample B in Table 1. The friction coefficient fluctuates here generally between 0.05 and 0.08 during a test of 10,000 friction cycles with a ball load of 5 N. Sample B is doped with 4.1 at % Zr. A similar behaviour is obtained with metal doped films with a metal content up to 20 at %.

Figure 3:
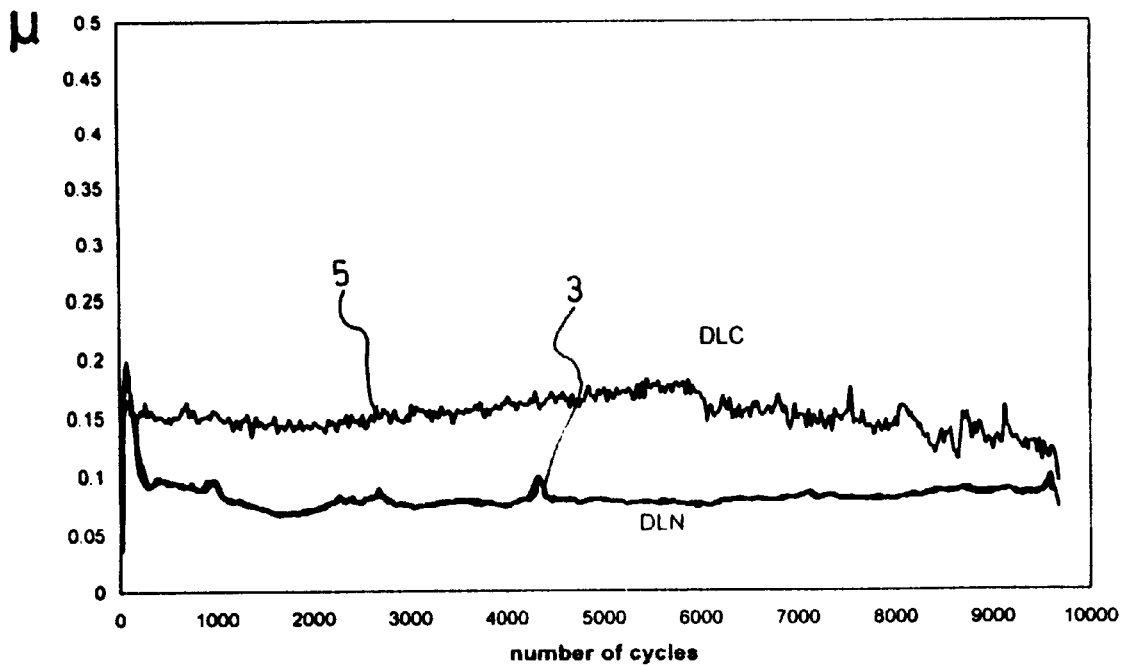
FIG. 3 is a graph comparing the coefficient of friction of the same doped DLN film as in FIG. 2 with a DLC film in air at 90% RH.

In FIG. 3, the friction behaviour of sample B (at 90% RH), as plotted in line 3 (see also FIG. 2), was compared with the same test on a typical DLC film. The hardness of such DLC-films is generally between 15 and 21 GPa and their hydrogen content is generally between 20 and 50 at%. The behaviour (friction coefficient) for the DLN-sample B was significantly better. This behaviour of sample B was also found to be better than for a Si-DLC film with about 10 to 15 at % Si.

Figure 4:
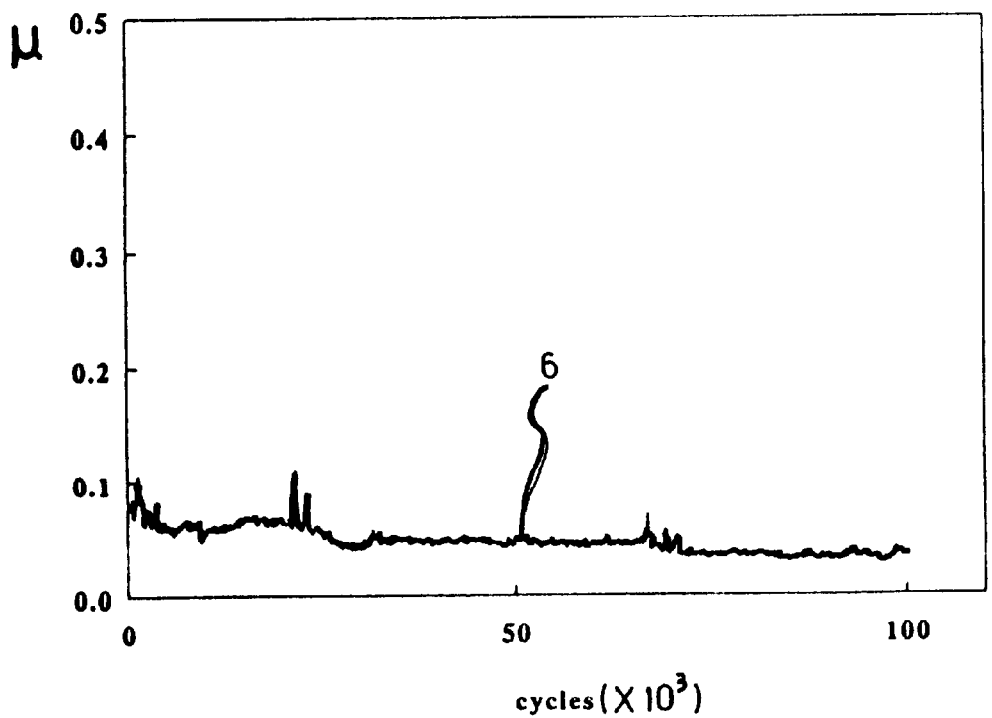
FIG. 4 is a graph presenting the variation of the coefficient of friction of an undoped DLN film during a long time when tested in water.

Finally, in FIG. 4 a long duration test (100,000 cycles) was carried out under water for a similar undoped DLN layer having a composition within the claimed ranges and with a thickness of 0.86 $\mu$m and with a 10 N ball load. Surprisingly this resulted in values for $\mu$ at about 0.05.

An undoped DLN-layer of the same kind, with a thickness of 1.3 $\mu$m, having a hardness of 15 GPa showed a coefficient of friction of approximately 0.05 both in air with a relative humidity of 50% and under water (as recorded in a ball-on-disk experiment during 100,000 cycles at 10 N normal load with a 6.35 mm diameter 100Cr6 steel bearing ball). The coating wear factor k calculated from the profilometric measurement of the wear track area was $2 \times 10^{-7}$ mm$^3$/Nm in air of 50% RH and only $3.5 \times 10^{-8}$ mm$^3$/Nm under water. The ball wear factor, calculated from the worn volume of the steel ball was below $1 \times 10^{-8}$ mm$^3$/Nm in both cases.

The film of sample C (see Table 1) on a Si-wafer showed a hardness of 17 GPa and $\mu$ varied from 0.05 to 0.06 in a 10,000 cycle friction test (load 5N) in air at RH 50% as for the samples A and B (in FIGS. 1 and 2).

The atomic concentrations in Table 1 can be indirectly obtained through Rutherford Backscattering Spectrometry (RBS) and Elastic Recoil Detection (ERD). RBS and ERD yield absolute numbers of the area concentration (in atoms/cm$^2$). They are expressed for sample C in Table 2 below as the atomic area density: AAD (in $10^{15}$ atoms/cm$^2$). Table 2 lists also the corresponding XPS-values (X-Ray Photoelectron Spectroscopy) which indicate the relative value of the concentrations (in %) of the elements (except H and Ar) in sample C. The real value correlating to this experimental data are listed in the line "Real". These "Real" values correspond then of course to the at % concentrations listed in Table 2 for sample C.

TABLE 2

| | sample C | | | | | |
|---|---|---|---|---|---|---|
| | H | C | Si | O | Zr | Ar |
| AAD | 2230 | 4641 | 672 | 525 | — | 123 |
| XPS | — | 78 | 14 | 8 | — | — |
| Real | 27.2 | 56.6 | 8.2 | 6.4 | — | 1.5 |

The atomic concentrations (by RBS) for C, Si and O and Ar are accurate to about 5% of their value, whereas the at % for H is expected to be correct up to 10% of its value.

The DLN films according to the invention are of course very suitable for any application or use where the presence of a very low coefficient of friction and at the same time a high hardness are required, in particular in very humid environments or in water. The application is thus useful as a low friction coating in prostheses for hip or knee joint replacement, for surgical knives, for razor blades and guide wires. They are also useful as protective coatings on hard disks for computers and on magnetic tapes.

What is claimed is:

1. An improved diamond-like nanocomposite composition comprising networks of a-C:H and a-Si:O wherein the H-concentration is between 40% and 80% of the C-concentration and having a coefficient of friction against steel which is smaller than 0.1 in air with a relative humidity up to 90%, or in water.

2. A composition according to claim 1 comprising 30 to 70 at % of C, 20 to 40 at % of H, 5 to 15 at % of Si and 5 to 15 at % of O.

3. A composition according to claim 2 comprising 45 to 70 at % of C, 20 to 35 at % of H, 5 to 10 at % of Si and 5 to 10 at % of O.

4. A composition according to claim 1 which is doped with at least one transition metal.

5. A composition according to claim 4 wherein said transition metal is Zr, Ti or W.

6. A composition according to claim 1 comprising 0.5 to 5 at % of an inert gas.

7. A composition according to claim 6 wherein the gas is Ar or Kr or N.

8. A composition according to claim 1 having a hardness between 10 and 21 GPa as measured by nano indentation.

9. A substrate, covered at least in part with a layer of the composition according to claim 1, wherein the thickness of the layer is between 0.01$\mu$ and 10 $\mu$m.

10. A process for manufacturing in a vacuum chamber a covered substrate according to claim 9 comprising the steps of
   (a) introducing in said chamber a liquid organic precursor containing the elements C, H, Si and O to be deposited in the suitable proportions,
   (b) forming a plasma from the introduced precursor by an electron assisted DC-discharge using a filament with a filament current of 50–150 A, a negative filament DC bias voltage of 50–300 V and with a plasma current between 0.1 and 20 A and
   (c) depositing the composition on the substrate, to which a negative DC- bias or negative RF self-bias voltage of 200 to 1200 V is applied, in order to attract ions formed in the plasma.

11. A process according to claim 10 wherein in step (a) the precursor is evaporated in said chamber during or after introduction.

12. A process according to claim 11 wherein said precursor is evaporated by heating between 30° C. and 150° C.

13. A process according to claim 10 wherein in step (c) the voltage is between 250 and 1000 V.

14. A process according to claim 10 wherein the precursor is an organosilicon compound.

15. A process according to claim 14 wherein the compound is a polyphenylmethylsiloxane.

16. A process according to claim 15 wherein the compound is triphenylnonamethylpentasiloxane.

17. A process according to claim 10 wherein the frequency of the RF-voltage is between 30 and 1000 kHz.

18. A process according to claim 10 wherein, during the deposition, an inert gas is introduced in the vacuum chamber, ionised and incorporated by ion bombardment of the growing nanocomposite layer.

19. A process according to claim 10 wherein, during the deposition process at least one transition metal is codeposited in the composition layer by ion sputtering or by thermal evaporation.

\* \* \* \* \*